United States Patent
Odate

(10) Patent No.: US 11,104,367 B2
(45) Date of Patent: Aug. 31, 2021

(54) STEERING WHEEL UNIT

(71) Applicant: HONDA MOTOR CO., LTD., Tokyo (JP)

(72) Inventor: Shotaro Odate, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 144 days.

(21) Appl. No.: 16/039,434

(22) Filed: Jul. 19, 2018

(65) Prior Publication Data
US 2019/0023310 A1    Jan. 24, 2019

(30) Foreign Application Priority Data
Jul. 24, 2017 (JP) .............................. JP2017-142391

(51) Int. Cl.
| | | |
|---|---|---|
| B62D 1/04 | (2006.01) | |
| B62D 5/04 | (2006.01) | |
| G07C 5/08 | (2006.01) | |
| B62D 15/02 | (2006.01) | |
| G01D 5/241 | (2006.01) | |

(Continued)

(52) U.S. Cl.
CPC ............. *B62D 1/04* (2013.01); *B62D 5/049* (2013.01); *B62D 15/021* (2013.01); *G01D 5/241* (2013.01); *G07C 5/0808* (2013.01); *H03K 17/962* (2013.01); *B62D 6/00* (2013.01); *G01R 31/006* (2013.01); *G01R 31/2829* (2013.01); *G01R 31/50* (2020.01); *G01R 31/52* (2020.01)

(58) Field of Classification Search
CPC ........ B62D 5/049; B62D 1/04; B62D 15/021; B62D 6/00; G01D 5/241; G01R 31/50; G01R 31/006; G01R 31/2829; G07C 5/0808
See application file for complete search history.

(56) References Cited

U.S. PATENT DOCUMENTS

| | | | |
|---|---|---|---|
| 6,533,316 B2 * | 3/2003 | Breed | ................... B60R 21/235 280/735 |
| 9,342,074 B2 | 5/2016 | Dolgov et al. | |

(Continued)

FOREIGN PATENT DOCUMENTS

| | | |
|---|---|---|
| CN | 105264450 | 1/2016 |
| JP | 2006-103467 | 4/2006 |
| JP | 2015-147531 | 8/2015 |

OTHER PUBLICATIONS

2016 Tesla Model S Owner's Manual, Tesla (Year: 2016).*

(Continued)

*Primary Examiner* — Jelani A Smith
*Assistant Examiner* — Gabriel Anfinrud
(74) *Attorney, Agent, or Firm* — Amin, Turocy & Watson, LLP

(57) ABSTRACT

A steering wheel unit is equipped with an electrode which is provided on a steering wheel and constitutes an electrostatic capacitance sensor, a sensor circuit that passes an alternating current to the electrode, a comprehensive control unit adapted to energize the sensor circuit at a time of failure diagnosis, and a failure diagnosis unit that performs a short circuit failure diagnosis continuously or periodically when a power source of a vehicle is on, and performs an open circuit failure diagnosis when the power source of the vehicle is switched from off to on.

5 Claims, 7 Drawing Sheets

(51) Int. Cl.
*H03K 17/96* (2006.01)
*B62D 6/00* (2006.01)
*G01R 31/00* (2006.01)
*G01R 31/28* (2006.01)
*G01R 31/50* (2020.01)
*G01R 31/52* (2020.01)

(56) References Cited

U.S. PATENT DOCUMENTS

| | | | |
|---|---|---|---|
| 2004/0133326 A1* | 7/2004 | Ghoneim | B60W 40/09 |
| | | | 701/48 |
| 2013/0207677 A1* | 8/2013 | Togura | G01R 27/2605 |
| | | | 324/685 |
| 2015/0239494 A1* | 8/2015 | Fukunaga | B62D 5/0463 |
| | | | 701/43 |
| 2015/0298590 A1* | 10/2015 | Lamesch | H03K 17/962 |
| | | | 324/538 |
| 2016/0231142 A1* | 8/2016 | Kawano | G01D 5/24461 |
| 2017/0166236 A1* | 6/2017 | Iguchi | B62D 1/06 |

OTHER PUBLICATIONS

49 CFR Part 571 and 585, NHTSA (Year: 2007).*
Chinese Office Action and Search Report for Chinese Patent Application No. 201810821062.7 dated Dec. 24, 2020.

* cited by examiner

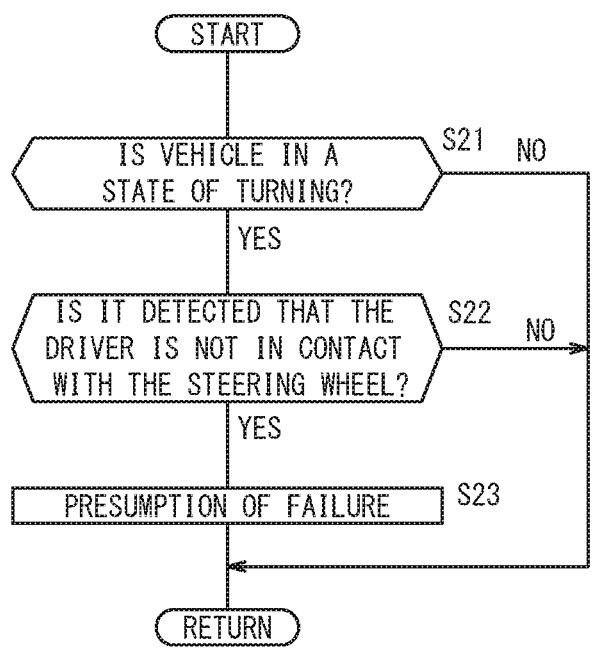

STEERING WHEEL UNIT

CROSS-REFERENCE TO RELATED APPLICATION

This application is based upon and claims the benefit of priority from Japanese Patent Application No. 2017-142391 filed on Jul. 24, 2017, the contents of which are incorporated herein by reference.

BACKGROUND OF THE INVENTION

Field of the Invention

The present invention relates to a steering wheel unit adapted to detect contact of a human body with respect to a steering wheel of a vehicle by an electrostatic capacitance sensor, and more particularly, relates to a steering wheel unit adapted to perform a failure diagnosis of the electrostatic capacitance sensor.

Description of the Related Art

Vehicles are known which are capable of switching between manual steering performed primarily by a driver, and automated steering performed primarily by a system. In such vehicles, detection is carried out as to whether or not the driver is in contact with (or is grasping) the steering wheel at a predetermined timing, for example, at a time of returning from automated steering to manual steering. An electrostatic capacitance sensor or a pressure sensor is used for detecting contact with the steering wheel. Japanese Laid-Open Patent Publication No. 2015-147531 discloses a steering wheel in which an electrostatic capacitance sensor is provided on a rim of the steering wheel. Japanese Laid-Open Patent Publication No. 2006-103467 discloses a steering wheel in which a pressure sensor is provided on a rim of the steering wheel, and a failure determination device for determining a failure of the pressure sensor.

SUMMARY OF THE INVENTION

With the electrostatic capacitance sensor disclosed in Japanese Laid-Open Patent Publication No. 2015-147531, a failure of the electrostatic capacitance sensor is not taken into consideration. The failure determination device in Japanese Laid-Open Patent Publication No. 2006-103467 relates to a pressure sensor, but does not relate to an electrostatic capacitance sensor. For this reason, there is room for consideration in relation to failure of an electrostatic capacitance sensor.

The present invention has been devised taking into consideration the aforementioned problems, and has the object of providing a steering wheel unit which is capable of diagnosing whether an electrostatic capacitance sensor provided in a steering wheel is faulty.

The present invention is characterized by a steering wheel unit configured to detect contact of a human body with respect to a steering wheel of a vehicle by an electrostatic capacitance sensor, including:

an electrode which is provided on the steering wheel and constitutes the electrostatic capacitance sensor;

an energizing unit configured to pass an alternating current to the electrode;

a control unit configured to energize the energizing unit at a time of failure diagnosis; and a failure diagnosis unit configured to perform a short circuit failure diagnosis continuously or periodically when a power source of the vehicle is on, and perform an open circuit failure diagnosis when the power source of the vehicle is switched from off to on.

In the case that the alternating current flows through the electrode that constitutes the electrostatic capacitance sensor, then when an open circuit failure such as a disconnection or the like occurs in the electrostatic capacitance sensor, the open location thereof corresponds to a capacitor. In such a case, there is a possibility of erroneously detecting that the human body is in contact with the steering wheel, regardless of the fact that the human body is not in contact therewith. Whether or not an open circuit failure occurs in the electrostatic capacitance sensor can be determined from a detection result of the electrostatic capacitance sensor at a time that the human body is not in contact with respect to the steering wheel. Stated otherwise, it is necessary for diagnosis of the open circuit failure to be performed on the premise that the driver is not in contact with the steering wheel. The driver has a tendency not to be in contact with the steering wheel when boarding the vehicle and when the power source of the vehicle is turned from off to on. With the above-described configuration, diagnosis of an open circuit failure is performed when the power source of the vehicle is switched from off to on. In this manner, not only is diagnosis of a short circuit failure performed, but by performing diagnosis of an open circuit failure at an appropriate timing, it is possible to increase the accuracy of the diagnostic result of an open circuit failure.

In the present invention, the failure diagnosis unit may be configured to calculate a combined impedance in an equivalent circuit of the electrostatic capacitance sensor, and may perform the open circuit failure diagnosis by comparing the calculated combined impedance with a combined impedance at a time of normal operation.

With the above-described configuration, the open circuit failure is detected on the basis of a difference in the combined impedances at a time of normal operation and at a time of an open circuit failure. In this manner, an open circuit failure can be detected by a simple method through a comparison of combined impedances.

In the present invention, the failure diagnosis unit may be configured to diagnose a short circuit failure in a case that a magnitude of an electrostatic capacitance detected by the electrostatic capacitance sensor does not undergo a change for a predetermined time period.

With the above-described configuration, a variation in the magnitude of the electrostatic capacitance, as detected by the electrostatic capacitance sensor, is monitored. In this manner, it is possible to detect a short circuit failure by a simple method of monitoring the variation in the electrostatic capacitance.

In the present embodiment, the vehicle is configured to switch between a manual steering mode and an automated steering mode, and the failure diagnosis unit may be configured to perform the open circuit failure diagnosis also during the automated steering mode.

With the above-described configuration, the open circuit failure diagnosis is performed not only when the vehicle power supply is switched from off to on, but also is carried out during automated steering in which there is a possibility that the driver is not in contact with the steering wheel. Therefore, it is possible to increase the number of times that the open circuit failure is diagnosed.

In the present invention, the failure diagnosis unit may be configured to perform the open circuit failure diagnosis also at a time of returning from the automated steering mode to the manual steering mode, and at that time, may perform the failure diagnosis based on a difference before and after restoration of the manual steering mode.

With the above-described configuration, the open circuit failure diagnosis also is performed at the time of returning from the automated steering mode to the manual steering mode, when there is a high possibility that the driver is switching from a state of not being in contact to a state of being in contact with the steering wheel. If the electrostatic capacitance sensor is operating normally, there is a high possibility that the detection result will change before and after restoration of the manual steering mode. At this time, if there is no difference in the detection result, there is a possibility that the electrostatic capacitance sensor is faulty. In this manner, it is possible to perform the failure determination by the difference in the detection result.

In the present invention, the steering wheel unit may further include a steering angle sensor and/or an angular velocity sensor configured to detect a turning state when the vehicle turns, wherein the failure diagnosis unit may be configured to diagnose that a failure has occurred in the electrostatic capacitance sensor, in a case that the turning state is detected by the steering angle sensor and/or the angular velocity sensor, and the contact of the human body with respect to the steering wheel is not detected.

When the vehicle is in a state of turning, the driver is operating the steering wheel. Stated otherwise, the driver is in contact with the steering wheel. In such a state, in the case that the detection value of the electrostatic capacitance sensor is a detection value at a time of contact, the electrostatic capacitance sensor is operating normally. On the other hand, in the case that the detection value of the electrostatic capacitance sensor is a detection value at a time of non-contact, it is presumed that the electrostatic capacitance sensor is faulty. In accordance with the above-described configuration, since a failure determination of the electrostatic capacitance sensor is performed using detection results of the steering angle sensor and/or the angular velocity sensor, the accuracy of the failure determination is improved.

According to the present embodiment, not only is diagnosis of a short circuit failure performed, but by performing diagnosis of an open circuit failure at an appropriate timing, it is possible to increase the accuracy of the diagnostic result of an open circuit failure.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 7 is a flowchart of a failure estimation process performed in the present embodiment.

DESCRIPTION OF THE PREFERRED EMBODIMENTS

A preferred embodiment of a steering wheel unit according to the present invention will be presented and described in detail below with reference to the accompanying drawings.

[1. Configuration of Vehicle 10]

Figure 1:
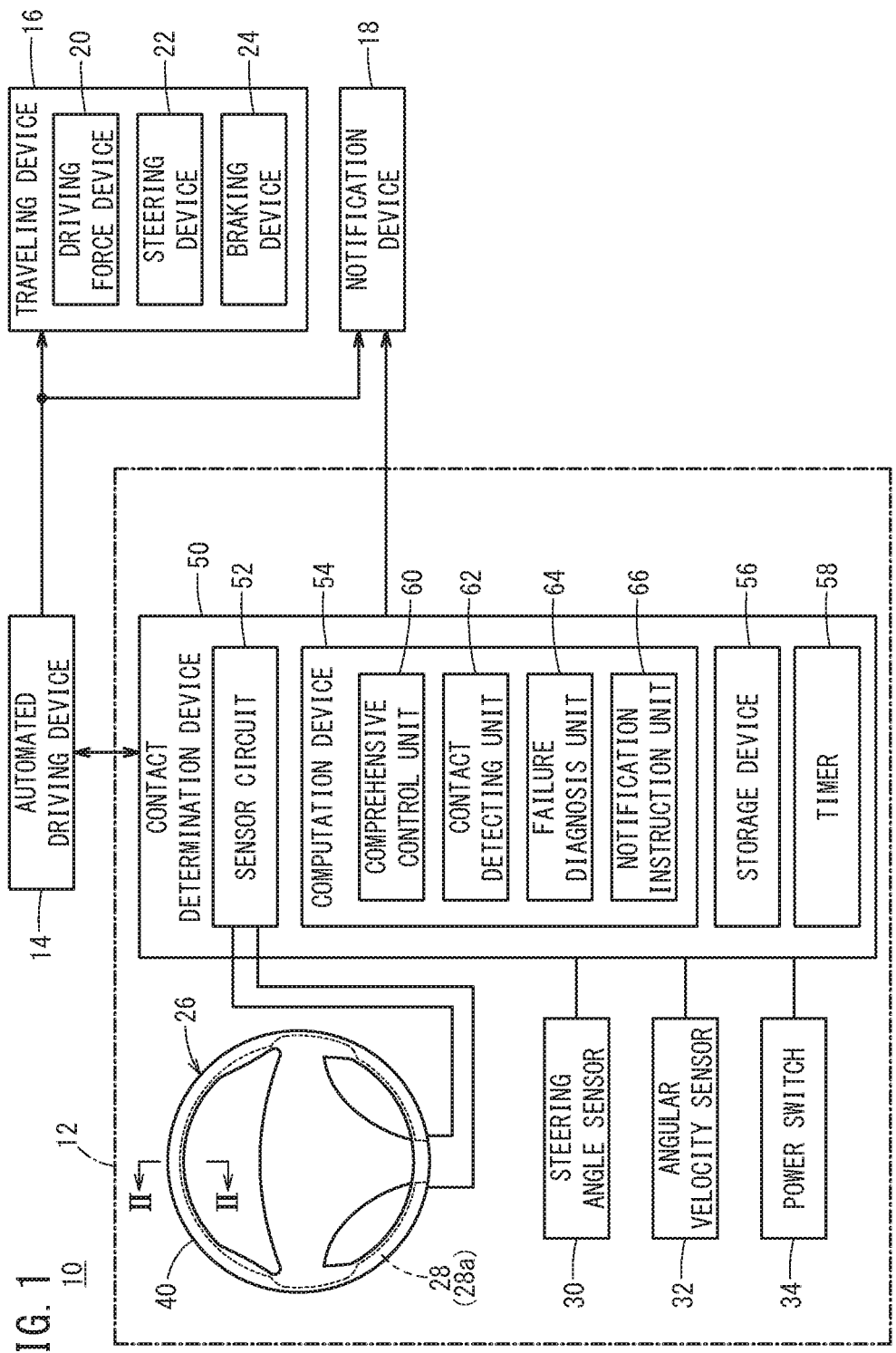
FIG. 1 is a configuration diagram of a steering wheel unit according to an embodiment of the present invention.

As shown in FIG. 1, a steering wheel unit 12 according to a present embodiment is provided in a vehicle 10. The vehicle 10 is capable of switching between a manual steering mode in which steering is primarily performed by a driver, and an automated steering mode in which steering is primarily performed by a system (an automated driving device 14). In the present embodiment, it is assumed that the vehicle 10 is an automatically driven vehicle which, in addition to steering, is capable of performing driving and braking operations primarily by the system. The vehicle 10 includes, in addition to the steering wheel unit 12, an automated driving device 14, a traveling device 16, and a notification device 18.

The automated driving device 14 is constituted by an ECU, and comprises a computation device such as a processor or the like, and a storage device including a ROM and a RAM, etc. The automated driving device 14 realizes various functions by the computation device executing programs stored in the storage device. The automated driving device 14 acquires information necessary for automated driving, such as external environmental information (detection results of cameras, radar devices, etc.), traveling state information (traveling velocity, acceleration/deceleration) of the vehicle 10, and navigation information and the like from various sensors and devices, and outputs control instructions for automated driving, steering, and braking operations to the traveling device 16.

In the traveling device 16, there are included a driving force device 20, a steering device 22, and a braking device 24. The driving force device 20 includes a driving force ECU, and a drive source including an engine and/or a driving motor. The driving force device 20 generates a driving force in accordance with an operation of an accelerator pedal performed by the driver, or a driving control instruction output from the automated driving device 14. The steering device 22 includes an electric power steering system (EPS) ECU, and an EPS actuator. The steering device 22 generates a steering force in accordance with an operation of a steering wheel 26 performed by the driver, or a steering control instruction output from the automated driving device 14. The braking device 24 includes a brake ECU and a brake actuator. The braking device 24 generates a braking force in accordance with an operation of the brake pedal performed by the driver, or a braking control instruction output from the automated driving device 14.

The notification device 18 includes a notification ECU, a display device, an acoustic device, and a haptic device. The notification device 18 issues notifications to the driver in accordance with notification instructions output from the automated driving device 14 or a later-described contact determination device 50.

[2. Configuration of Steering Wheel Unit 12]

The steering wheel unit 12 includes the steering wheel 26, the contact determination device 50, and a power switch 34.

The steering wheel unit 12 further includes as sensors an electrostatic capacitance sensor 28, a steering angle sensor 30, and an angular velocity sensor 32.

Figure 2:
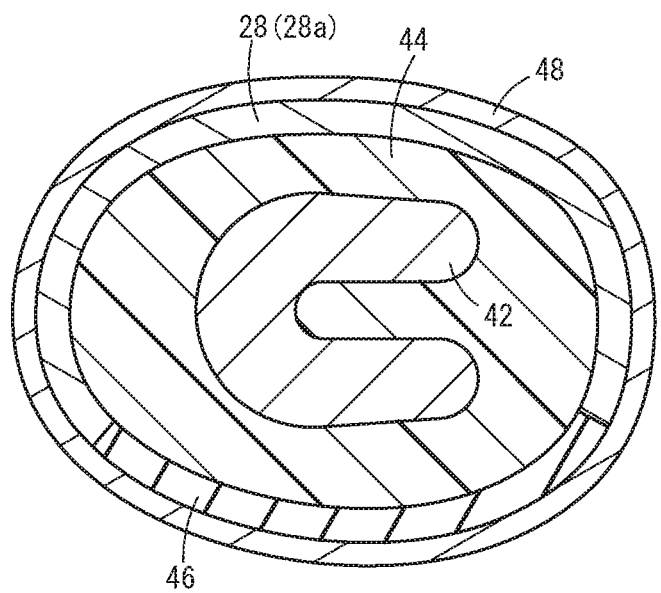
FIG. 2 is a cross-sectional view taken along line II-II of a steering wheel shown in FIG. 1.

As shown in FIG. 2, a rim 40 of the steering wheel 26 is of a laminated structure in which a cross section thereof (cross section parallel to a central axis of the steering wheel 26) is composed of a plurality of layers. On the rim 40, a metal core 42 corresponding to a skeletal structure is covered entirely with a resin 44, a portion or the entirety of the resin 44 is covered with the electrostatic capacitance sensor 28, a remaining portion of the resin 44 is covered by an elastic member 46, and the electrostatic capacitance sensor 28 and the elastic member 46 are covered by a leather cover 48.

The electrostatic capacitance sensor 28 corresponds to an electrode 28a made up from a conductive member, and is insulated from the surrounding members. The electrostatic capacitance sensor 28 is formed from a conductive material coating or a conductive sheet. The electrostatic capacitance sensor 28 is disposed along a circumferential direction of the rim 40. According to the present embodiment, one electrostatic capacitance sensor 28 is provided so as to encircle the rim 40 with a bottom part of the rim 40 serving as a boundary. Both ends of the electrostatic capacitance sensor 28 are insulated at the bottom part of the rim 40. The electrostatic capacitance sensor 28 forms a capacitor between itself and the steering wheel 26 and/or a human body in contact with the steering wheel 26, and measures a magnitude of the electrostatic capacitance, which changes in accordance with contact and non-contact of the human body with respect to the steering wheel 26. In the present specification, the value corresponding to the magnitude of the electrostatic capacitance is referred to as a detection value C.

The steering angle sensor 30 detects the steering angle of the steering wheel 26, and outputs a signal indicative of the steering angle to the contact determination device 50. The angular velocity sensor 32 detects an amount of angular movement of the vehicle 10, and outputs an electric signal indicative of the amount of angular movement to the contact determination device 50. Moreover, both the steering angle sensor 30 and the angular velocity sensor 32 may be provided, or only one of them may be provided.

The power switch 34 is a switch that is manually operated when the driver turns the power source of the vehicle 10 (hereinafter also referred to as a vehicle power supply) on or off, and is disposed in the vehicle cabin R. An ignition switch, for example, can be used as the power switch 34. The power switch 34 outputs an operation signal to the contact determination device 50 in accordance with an on/off operation thereof.

The contact determination device 50 is constituted by an ECU, and comprises a sensor circuit 52, a computation device 54 such as a processor or the like, a storage device 56 including a ROM and a RAM, etc., and a timer 58.

Figure 3:
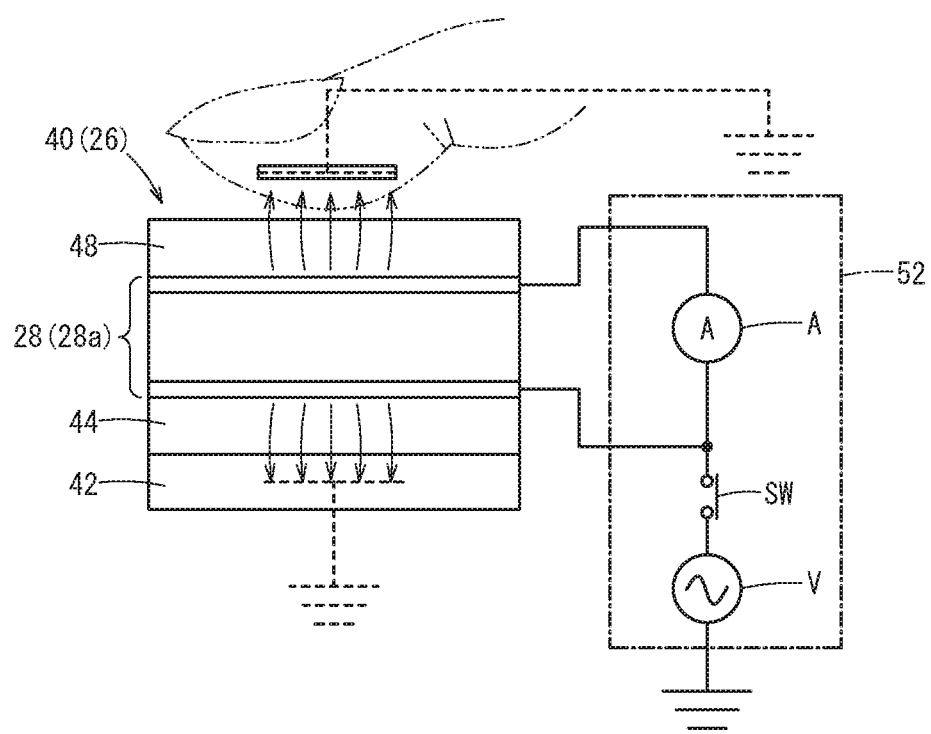
FIG. 3 is a simplified explanatory diagram of a circuit constituted by a sensor circuit and an electrostatic capacitance sensor.

As shown in FIG. 3, the sensor circuit 52 comprises an AC power source V for energizing the electrostatic capacitance sensor 28, a measurement device for measuring the detection value C corresponding to the magnitude of the electrostatic capacitance, and a switch SW for switching energization with respect to the electrostatic capacitance sensor 28 on or off. In this instance, a current sensor A for measuring current is provided as the measurement device. A measurement value of the current sensor A is proportional to the detected value C of the electrostatic capacitance sensor 28. Therefore, hereinafter, it will be assumed that the measurement value of the current sensor A corresponds to the detection value C. The sensor circuit 52 corresponds to an energizing unit that passes an alternating current to the electrostatic capacitance sensor 28 (the electrode 28a). One terminal of the AC power source V is connected to both ends of the electrostatic capacitance sensor 28, whereas the other terminal thereof is grounded. The current sensor A is connected in parallel to the electrostatic capacitance sensor 28.

The computation device 54 realizes various functions by executing programs stored in the storage device 56. In the present embodiment, the computation device 54 functions as a comprehensive control unit 60, a contact detecting unit 62, a failure diagnosis unit 64, and a notification instruction unit 66.

The comprehensive control unit 60 controls the processes performed by the computation device 54, together with carrying out processes with the exception of the processes performed by the contact detecting unit 62, the failure diagnosis unit 64, and the notification instruction unit 66. For example, the comprehensive control unit 60 controls operation of a switch SW of the sensor circuit 52, to thereby switch between energization and non-energization of the electrostatic capacitance sensor 28.

The contact detecting unit 62 recognizes the detection value C measured by the current sensor A of the sensor circuit 52, and detects whether or not the human body is in contact with the steering wheel 26 in accordance with the detection value C. In the present embodiment, the contact detecting unit 62 detects contact and non-contact of the human body with respect to the steering wheel 26, on the basis of a comparison result between the detection value C and a contact determination threshold value Cth.

The failure diagnosis unit 64 carries out a failure diagnosis on the electrostatic capacitance sensor 28. For example, diagnosis of a short circuit failure is performed continuously or periodically when the vehicle power supply is on. Further, diagnosis of an open circuit failure is carried out at a time that the vehicle power supply is switched from off to on, during automated driving (including during automated steering), and at a time of returning from an automated driving (including automated steering) mode to a manual driving (including manual steering) mode.

The notification instruction unit 66 outputs a notification instruction to the notification device 18 in the event there is a need for a notification to be issued to the driver.

Figure 6:
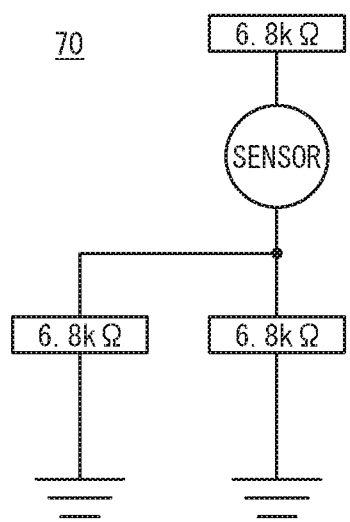
FIG. 6 is a diagram showing an equivalent circuit of the electrostatic capacitance sensor.

In addition to various programs, the storage device 56 stores various threshold values and predetermined values such as the contact determination threshold value Cth, which is used by the contact detecting unit 62 in order to determine whether or not a human body is in contact or is not in contact with the steering wheel 26, and a combined impedance Zn at a time of normal operation of a later-described equivalent circuit 70 (see FIG. 6) of the electrostatic capacitance sensor 28.

The timer 58 starts measuring time from a point in time when the contact determination device 50 has received a power-on operation signal output from the power switch 34.

[3. Operations of the Steering Wheel Unit 12]

[3.1. Contact Detection Process]

The contact detecting unit 62 carries out a contact determination when the vehicle power supply is on. At a timing at which the vehicle power supply is placed in an on state, the comprehensive control unit 60 switches the sensor circuit 52 from an off state to an on state, and starts to energize or supply current to the electrostatic capacitance sensor 28. The contact detecting unit 62 determines a state of contact in the case that the detection value C of the electrostatic capacitance sensor 28 is greater than or equal to the contact determination threshold value Cth stored in the storage device 56, and determines a non-contact state in the case that the detection value C is less than the contact determination threshold value Cth. In the event it is determined that the driver is not in contact with the steering wheel 26 despite the fact that the driver is required to be in contact with the steering wheel 26, the notification instruction unit 66 outputs a notification instruction to the notification device 18.

[3.2. Failure Diagnosis Process]

Figure 4:
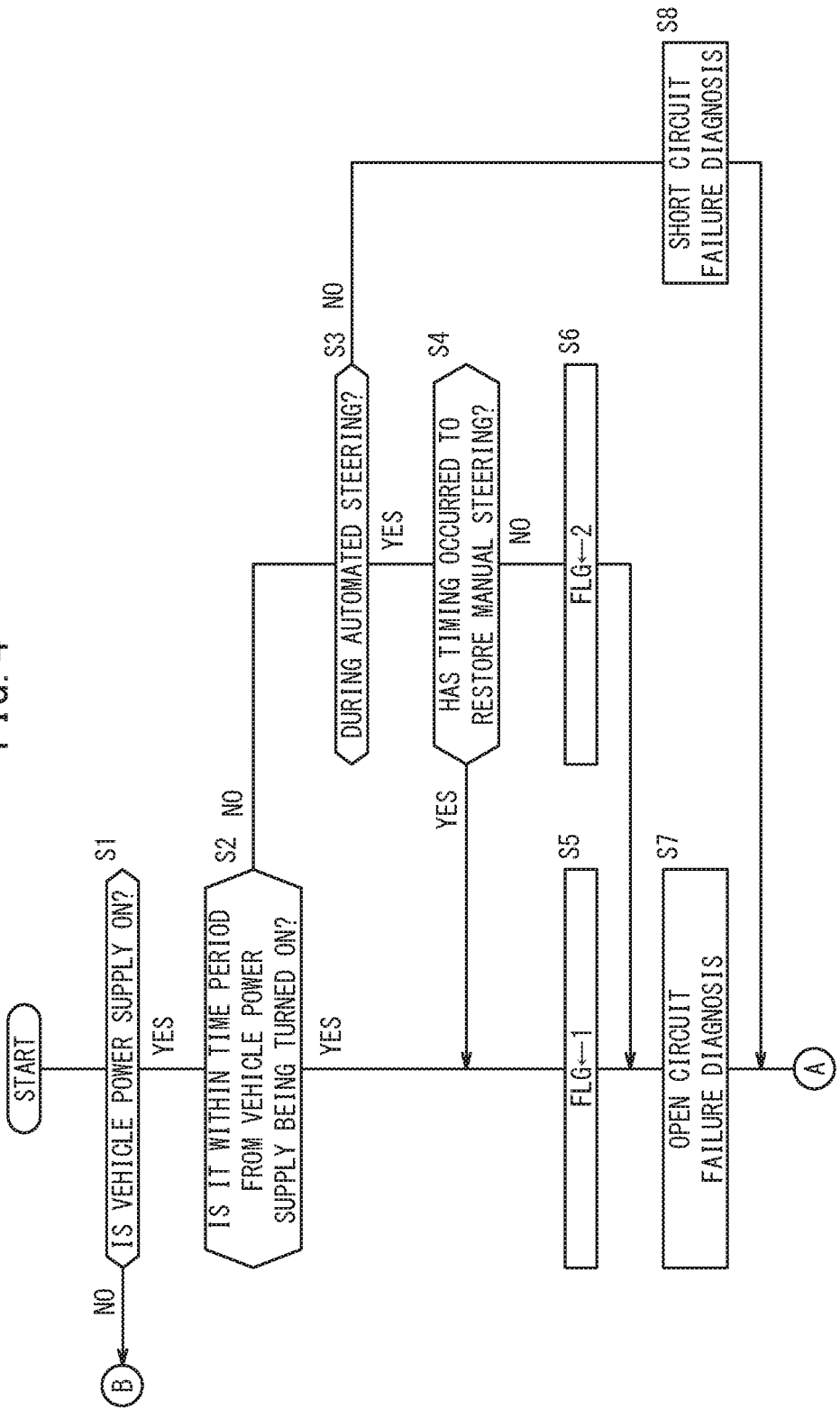
FIG. 4 is a flowchart of a failure diagnosis process performed in the present embodiment.
Figure 5:
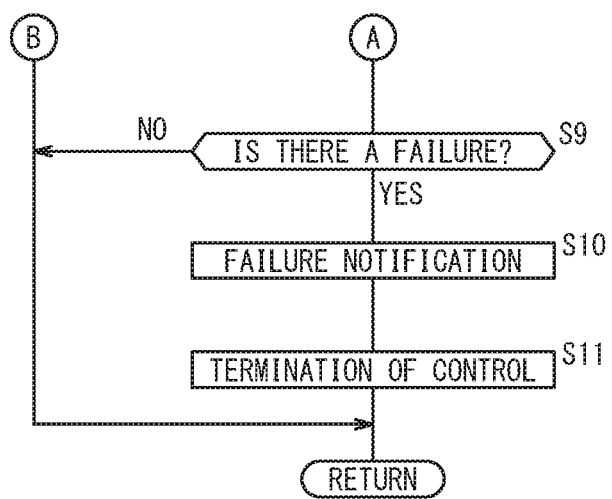
FIG. 5 is a flowchart of the failure diagnosis process performed in the present embodiment.

A failure diagnosis process performed by the steering wheel unit 12 will be described with reference to FIGS. 4 and 5. The series of processes described below is repeatedly executed at predetermined time intervals.

In step S1, the failure diagnosis unit 64 determines whether or not the vehicle power supply is in an on state. The failure diagnosis unit 64 determines that the vehicle power supply is on in the case that the contact determination device 50 is receiving the power-on operation signal output from the power switch 34, and determines that the vehicle power supply is off if the power-on operation signal is not being received. In the case that the vehicle power supply is on (step S1: YES), the process proceeds to step S2. On the other hand, in the case that the vehicle power supply is off (step S1: NO), the series of processes is brought to an end, and it is waited until a subsequent series of processes is started.

Upon transitioning from step S1 to step S2, the failure diagnosis unit 64 determines whether or not a predetermined time period has elapsed since the vehicle power supply was placed in the on state. In the case that the time measured by the timer 58 lies within a predetermined time period (step S2: YES), the process proceeds to step S5. On the other hand, in the case that the time measured by the timer 58 has exceeded the predetermined time period (step S2: NO), the process proceeds to step S3.

Upon transitioning from step S2 to step S3, the failure diagnosis unit 64 determines whether or not the vehicle 10 is traveling by way of automated steering. The automated driving device 14 outputs a start signal to the contact determination device 50, at a timing at which automated driving (including automated steering) is started. In the case that the contact determination device 50 receives the start signal output from the automated driving device 14, the failure diagnosis unit 64 determines that automated steering is taking place, whereas in the case that the start signal is not received, the failure diagnosis unit 64 determines that manual steering is taking place. In the case that automated steering is taking place (step S3: YES), the process proceeds to step S4. On the other hand, in the case that automated steering is not taking place (step S3: NO), the process proceeds to step S8.

Upon transitioning from step S3 to step S4, the failure diagnosis unit 64 determines whether or not a timing has occurred to return to the manual steering mode. When the automated driving device 14 determines, during a time of automated steering, that it is necessary to return to the manual steering mode, for example, when the vehicle 10 approaches a terminal position of an automated driving segment, the automated driving device 14 outputs a notification instruction to the notification device 18 in order to prompt the driver to perform manual steering. At this time, the automated driving device 14 outputs a restoration signal to the contact determination device 50 indicating that a timing has arrived to return to the manual steering mode. In the case that the contact determination device 50 receives the restoration signal output from the automated driving device 14, the failure diagnosis unit 64 determines that a timing has arrived to return to the manual steering mode, whereas if the restoration signal is not received, the failure diagnosis unit 64 determines that such a timing to return to the manual steering mode has not occurred. In the case that a timing occurs to return to the manual steering mode (step S4: YES), the process proceeds to step S5. On the other hand, in the case that a timing to return to the manual steering mode has not occurred (step S4: NO), the process transitions to step S6.

Upon transitioning from step S2 or step S4 to step S5, the failure diagnosis unit 64 sets a failure diagnosis flag FLG to 1, whereupon the process proceeds to step S7. Upon transitioning from step S4 to step S6, the failure diagnosis unit 64 sets the failure diagnosis flag FLG to 2, whereupon the process proceeds to step S7.

In step S7, the failure diagnosis unit 64 performs diagnosis of an open circuit failure. At this time, when the failure diagnosis flag FLG is 1, the failure diagnosis unit 64 performs diagnosis of the open circuit failure in the manner described below. On the other hand, when the failure diagnosis flag FLG is 2, diagnosis of the open circuit failure is put on hold. In a state in which the failure diagnosis flag FLG is set to 2, and more specifically, in a state in which, during automated driving, the timing to return to the manual steering mode has not occurred, there is a possibility that the driver may be in contact with the steering wheel 26. For this reason, diagnosis of the open circuit failure is suspended or put on hold. Moreover, in the case that the hold time exceeds a predetermined time period, diagnosis of the open circuit failure may be performed, or diagnosis of the open circuit failure may be performed even in the case that the failure diagnosis flag FLG is 2. The threshold value at the time of the open circuit failure diagnosis may be made higher in the case that the failure diagnosis flag FLG is 2 than in the case that the failure diagnosis failure flag FLG is 1, so that diagnosis that there is a failure is less likely to occur.

The failure diagnosis unit 64 calculates the combined impedance Z of the electrostatic capacitance sensor 28, on the basis of the measurement value of the current sensor A of the sensor circuit 52. Calculation of the combined impedance Z is based on the equivalent circuit 70 of the electrostatic capacitance sensor 28 shown in FIG. 6, for example. The equivalent circuit 70 is a series circuit of one element, and two elements which are connected in parallel. In this instance, for convenience of explanation, it is assumed that the impedance of each of the elements is 6.8 [kΩ]. In such an equivalent circuit 70, a combined impedance Zn at a time of normal operation is $\{(6.8 \times 6.8)/(6.8+6.8)\}+6.8=10.2$ [kΩ]. On the other hand, the combined impedance Za at a time of an open circuit failure is $6.8+6.8=13.6$ [kΩ]. In this manner, a difference occurs in the combined impedances Z of the equivalent circuit 70 between the time of normal operation and the time of an open circuit failure.

In the case that the combined impedance Z is greater than the combined impedance Zn, the failure diagnosis unit 64 diagnoses that an open circuit failure is occurring, whereas, in the case that the combined impedance Z is less than or equal to the combined impedance Zn, the failure diagnosis unit 64 diagnoses that an open circuit failure is not occurring. Alternatively, it may be diagnosed that an open circuit failure is occurring in the case that a difference between the combined impedance Z and the combined impedance Zn is greater than or equal to a predetermined value, and it may be diagnosed that an open circuit failure is not occurring in the case that the difference is less than the predetermined value.

In the case of performing the failure diagnosis at a time of returning to the manual steering mode (step S4: YES), the automated driving device 14, after having output the restoration signal, outputs a switching signal at the timing at which switching takes place from the automated steering mode to the manual steering mode. In this case, the failure diagnosis unit 64 may compare the combined impedances Z before and after the contact determination device 50 receives the switching signal. In this case, the failure diagnosis unit 64 diagnoses that an open circuit failure is occurring in the case that a difference between the combined impedances Z before and after restoration is greater than or equal to a predetermined value, and diagnoses that an open circuit failure is not occurring in the case that the difference is less than the predetermined value.

Upon transitioning from step S3 to step S8, the failure diagnosis unit 64 performs diagnosis of a short circuit failure. Diagnosis of the short circuit failure is performed continuously or periodically. The failure diagnosis unit 64 monitors the magnitude of the electrostatic capacitance detected by the electrostatic capacitance sensor 28, and in this instance, the detection value C is monitored for a predetermined time period. In addition, in the case that the detection value C is in excess of a normal range of variation, and variations occurring within the predetermined time period fall within a predetermined width, a diagnosis is made that a short circuit failure has occurred. Further, in the case that the detection value C lies within the normal range of variation, a diagnosis is made that a short circuit failure has not occurred.

In step S9, the presence or absence of a failure is determined. In the case that the failure diagnosis unit 64 has diagnosed that there is a failure in step S7 or step S8 (step S9: YES), the process proceeds to step S10. On the other hand, in the case that the failure diagnosis unit 64 has diagnosed that a failure has not occurred, or if the failure diagnosis has been put on hold in step S7 (step S9: NO), the series of processes is brought to an end, and it is waited until a subsequent series of processes is started.

Upon transitioning from step S9 to step S10, the notification instruction unit 66 outputs a notification instruction to the notification device 18 in order to issue a notification with respect to the driver. The notification device 18 which has received the notification instruction issues a notification to the driver indicating that the electrostatic capacitance sensor 28 is faulty.

In step S11, the comprehensive control unit 60 switches the sensor circuit 52 from an on state to an off state, and stops supplying current to the electrostatic capacitance sensor 28. In addition, control of the contact detection performed by the contact determination device 50 is terminated.

[3.3. Failure Estimation Process]

A failure estimation process performed by the steering wheel unit 12 will be described with reference to FIG. 7. The series of processes described below is repeatedly executed at predetermined time intervals. Moreover, the series of processes described below is executed when automated steering by the automated driving device 14 is not being performed, and more specifically, during a time of manual steering.

In step S21, on the basis of the detection result of the steering angle sensor 30 and/or the angular velocity sensor 32, the failure diagnosis unit 64 determines whether or not the vehicle 10 is in a turning state during which the vehicle 10 is turning. In the case that the vehicle 10 is in a state of turning (step S21: YES), the process proceeds to step S22. On the other hand, in the case that the vehicle 10 is not in a state of turning (step S21: NO), the series of processes is brought to an end, and it is waited until a subsequent series of processes is started.

In step S22, in the failure diagnosis unit 64, on the basis of the detection result of the contact detecting unit 62, it is detected whether or not the driver is in a non-contact state with respect to the steering wheel 26. In the case that the non-contact state is detected (step S22: YES), the process proceeds to step S23. On the other hand, in the case that contact with the steering wheel 26 is detected (step S22: NO), the series of processes is brought to an end, and it is waited until a subsequent series of processes is started.

In step S23, the failure diagnosis unit 64 estimates that a failure has occurred in the electrostatic capacitance sensor 28. When the vehicle 10 is turning, the driver is operating the steering wheel 26. At this time, the fact that non-contact with the steering wheel 26 is detected implies that it cannot be detected that the driver is in contact with the steering wheel 26, and more specifically, a presumption is made that the electrostatic capacitance sensor 28 is suffering from a failure. In this case, the failure diagnosis unit 64 outputs an instruction to the automated driving device 14 in order to prohibit automated steering thereafter. The notification instruction unit 66 outputs a notification instruction with respect to the notification device 18, whereby a notification is issued to the driver that a failure is occurring in the electrostatic capacitance sensor 28.

[4. Summary of the Present Embodiment]

The steering wheel unit 12 is equipped with the electrode 28a which is provided on the steering wheel 26 and constitutes the electrostatic capacitance sensor 28, the sensor circuit 52 (energizing unit) configured to pass an alternating current to the electrode 28a, the comprehensive control unit 60 (control unit) configured to energize the sensor circuit 52 at a time of failure diagnosis, and the failure diagnosis unit 64 configured to perform a short circuit failure diagnosis continuously or periodically when a power source of the vehicle 10 is on, and perform an open circuit failure diagnosis when the power source (vehicle power supply) of the vehicle 10 is switched from off to on (step S2: YES).

In the case that an alternating current flows through the electrode 28a that constitutes the electrostatic capacitance sensor 28, then when an open circuit failure such as a disconnection or the like occurs in the electrostatic capacitance sensor 28, the open location thereof corresponds to a capacitor. In such a case, there is a possibility of erroneously detecting that the human body is in contact with the steering wheel 26, regardless of the fact that the human body is not in contact therewith. Whether or not an open circuit failure occurs in the electrostatic capacitance sensor 28 can be determined from the detection result of the electrostatic capacitance sensor 28 at a time that the human body is not in contact with respect to the steering wheel 26. Stated otherwise, it is necessary for diagnosis of the open circuit failure to be performed on the premise that the driver is not in contact with the steering wheel 26. The driver has a tendency not to be in contact with the steering wheel 26 when boarding the vehicle 10 and when the power source of the vehicle 10 is turned from off to on. With the above-described configuration, diagnosis of the open circuit failure is performed when the power source of the vehicle 10 is switched from off to on. In this manner, not only is diagnosis of a short circuit failure performed, but by performing diagnosis of an open circuit failure at an appropriate timing, it is possible to increase the accuracy of the diagnostic result of an open circuit failure.

The failure diagnosis unit 64 is configured to calculate the combined impedance Z in the equivalent circuit 70 of the electrostatic capacitance sensor 28, and perform the open circuit failure diagnosis by comparing the calculated combined impedance Z with a combined impedance Zn at a time of normal operation.

With the above-described configuration, the open circuit failure is detected on the basis of a difference in the combined impedances at a time of normal operation and at a time of an open circuit failure. In this manner, an open circuit failure can be detected by a simple method through a comparison of combined impedances.

The failure diagnosis unit 64 is configured to diagnose the short circuit failure in the case that the magnitude of an electrostatic capacitance detected by the electrostatic capacitance sensor 28 does not undergo a change for a predetermined time period.

With the above-described configuration, a variation in the magnitude of the electrostatic capacitance, as detected by the electrostatic capacitance sensor 28, is monitored. In this manner, it is possible to detect a short circuit failure by a simple method of monitoring the variation in the electrostatic capacitance.

The vehicle 10 is configured to switch between the manual steering mode and the automated steering mode, and the failure diagnosis unit 64 is configured to perform the open circuit failure diagnosis also during the automated steering mode (step S3: YES).

With the above-described configuration, the open circuit failure diagnosis is performed not only when the vehicle power supply is switched from off to on, but also is carried out during automated steering in which there is a possibility that the driver is not in contact with the steering wheel 26. Therefore, it is possible to increase the number of times that the open circuit failure is diagnosed.

The failure diagnosis unit 64 is configured to perform the open circuit failure diagnosis also at the time of returning from the automated steering mode to the manual steering mode (step S4: YES). At that time, the failure diagnosis is performed based on the difference, and more specifically, the difference in the combined impedances Z of the equivalent circuit 70 before and after restoration of the manual steering mode.

With the above-described configuration, the open circuit failure diagnosis also is performed at the time of returning from the automated steering mode to the manual steering mode, when there is a high possibility that the driver is switching from a state of not being in contact to a state of being in contact with the steering wheel 26. If the electrostatic capacitance sensor 28 is operating normally, there is a high possibility that the detection result will change before and after restoration of the manual steering mode. At this time, if there is no difference in the detection result, there is a possibility that the electrostatic capacitance sensor 28 is faulty. In this manner, it is possible to perform the failure determination by the difference in the detection result.

The steering wheel unit 12 includes the steering angle sensor 30 and/or the angular velocity sensor 32 configured to detect the turning state when the vehicle 10 turns. The failure diagnosis unit 64 is configured to diagnose that a failure has occurred in the electrostatic capacitance sensor 28, in the case that the turning state is detected by the steering angle sensor 30 and/or the angular velocity sensor 32, and the contact of the human body with respect to the steering wheel 26 is not detected.

When the vehicle 10 is in a state of turning, the driver is operating the steering wheel 26. Stated otherwise, the driver is in contact with the steering wheel 26. In such a state, in the case that the detection value of the electrostatic capacitance sensor 28 is a detection value at a time of contact, the electrostatic capacitance sensor 28 is operating normally. On the other hand, in the case that the detection value of the electrostatic capacitance sensor 28 is a detection value at a time of non-contact, it is presumed that the electrostatic capacitance sensor 28 is faulty. In accordance with the above-described configuration, since the failure determination of the electrostatic capacitance sensor 28 is performed using the detection results of the steering angle sensor 30 and/or the angular velocity sensor 32, the accuracy of the failure determination is improved.

The present invention is not particularly limited to the embodiment described above, and various modifications are possible without departing from the essence and gist of the present invention.

What is claimed is:

1. A steering wheel unit configured to detect contact of a human body with respect to a steering wheel of a vehicle by an electrostatic capacitance sensor, comprising:
   an electrode which is provided on the steering wheel and constitutes the electrostatic capacitance sensor; an energizing unit configured to pass an alternating current to the electrode;
   a control unit configured to energize the energizing unit at a time of failure diagnosis;
   a timer starting timing measurement upon receipt of a power-on operation signal output from a power switch; and
   a failure diagnosis unit configured to perform a short circuit failure diagnosis continuously or periodically when a power source of the vehicle is on, and perform an open circuit failure diagnosis when a timing measured by the timer lies within a predetermined time; and
   an automated driving device configured to control the vehicle in either a manual steering mode or an automated steering mode, wherein the failure diagnosis unit is configured to perform the open circuit failure diagnosis also at a time of receiving a restoration signal output from the automated driving device for returning from the manual steering mode to the automated steering mode, based on a difference before and after restoration of the manual steering mode.

2. The steering wheel unit according to claim 1, wherein the failure diagnosis unit is configured to calculate a combined impedance in an equivalent circuit of the electrostatic capacitance sensor, and perform the open circuit failure diagnosis by comparing the calculated combined impedance with a combined impedance at a time of normal operation.

3. The steering wheel unit according to claim 1, wherein the failure diagnosis unit is configured to diagnose a short circuit failure in a case that a magnitude of an electrostatic capacitance detected by the electrostatic capacitance sensor does not undergo a change for a predetermined time period.

4. The steering wheel unit according to claim 1, wherein:
   the failure diagnosis unit is configured to perform the open circuit failure diagnosis also during the automated steering mode.

5. The steering wheel unit according to claim 1, further comprising:
   a steering angle sensor and/or an angular velocity sensor configured to detect a turning state when the vehicle turns;
   wherein the failure diagnosis unit is configured to diagnose that a failure has occurred in the electrostatic capacitance sensor, in a case that the turning state is detected by the steering angle sensor and/or the angular velocity sensor, and the contact of the human body with respect to the steering wheel is not detected.

* * * * *